United States Patent
Verschueren et al.

(10) Patent No.: US 10,978,000 B2
(45) Date of Patent: Apr. 13, 2021

(54) ACTIVE MATRIX DISPLAY AND METHOD FOR DRIVING AN ACTIVE MATRIX DISPLAY

(71) Applicants: IMEC VZW, Leuven (BE); Katholieke Universiteit Leuven, KU LEUVEN R&D, Leuven (BE)

(72) Inventors: Lynn Verschueren, Bertem (BE); Kris Myny, Heusden-Zolder (BE); Jan Genoe, Testelt (BE); Wim Dehaene, Kessel-Lo (BE)

(73) Assignee: IMEC vzw, Leuven (BE)

( * ) Notice: Subject to any disclaimer, the term of this patent is extended or adjusted under 35 U.S.C. 154(b) by 0 days.

(21) Appl. No.: 16/414,373

(22) Filed: May 16, 2019

(65) Prior Publication Data

US 2019/0355308 A1    Nov. 21, 2019

(30) Foreign Application Priority Data

May 17, 2018  (EP) .................................... 18172981

(51) Int. Cl.
*G09G 3/3258* (2016.01)
*G09G 3/3233* (2016.01)
*H01L 27/32* (2006.01)

(52) U.S. Cl.
CPC ......... *G09G 3/3258* (2013.01); *G09G 3/3233* (2013.01); *H01L 27/3262* (2013.01); *G09G 2310/0264* (2013.01)

(58) Field of Classification Search
CPC . G09G 3/3258; G09G 3/3233; H01L 27/3262
See application file for complete search history.

(56) References Cited

U.S. PATENT DOCUMENTS

| 5,726,916 A | 3/1998 | Smyth |
| 6,416,480 B1 | 7/2002 | Nenov |
| 2006/0149493 A1* | 7/2006 | Sambandan ......... G09G 3/3233 702/118 |
| 2006/0256058 A1* | 11/2006 | Asano .................. G09G 3/3233 345/92 |

(Continued)

OTHER PUBLICATIONS

Extended European Search Report and Written Opinion, EP App. No. 19170306.5, dated Oct. 25, 2019, 7 pages.

*Primary Examiner* — Alexander Eisen
*Assistant Examiner* — Cory A Almeida
(74) *Attorney, Agent, or Firm* — McDonnell Boehnen Hulbert & Berghoff LLP (57) ABSTRACT

A method for driving an active matrix display comprising a plurality of pixels, wherein each pixel comprises a drive transistor having a driver gate, is disclosed. The method comprises: receiving information of a desired image to be displayed; determining a compensated voltage for the driver gate for each pixel based on calibration data, wherein the calibration data comprises a set of individual calibration values applying to different pixels, and wherein the compensated voltage compensates for differences between pixels affecting a relation of an intensity of light output by the pixel as function of a difference between the voltage applied to the driver gate and a threshold voltage of the drive transistor; and outputting the compensated voltage for the driver gate for each of the pixels.

20 Claims, 3 Drawing Sheets

(56) References Cited

U.S. PATENT DOCUMENTS

| | | | |
|---|---|---|---|
| 2009/0058772 A1* | 3/2009 | Lee | G09G 3/3233 345/82 |
| 2010/0069775 A1 | 3/2010 | Milgramm et al. | |
| 2013/0242077 A1 | 9/2013 | Lin et al. | |
| 2014/0168194 A1* | 6/2014 | Kong | G09G 3/3233 345/212 |
| 2017/0150897 A1 | 6/2017 | Komaki | |
| 2018/0341328 A1 | 11/2018 | Agell et al. | |

* cited by examiner

ACTIVE MATRIX DISPLAY AND METHOD FOR DRIVING AN ACTIVE MATRIX DISPLAY

CROSS-REFERENCE TO RELATED APPLICATION

The present application is a non-provisional patent application claiming priority to European Patent Application No. 18172981.5 filed May 17, 2018, the contents of which are hereby incorporated by reference.

TECHNICAL FIELD

The present disclosure relates to an active matrix display and a method for driving an active matrix display. In particular, the present disclosure relates to compensating for non-uniform display behavior.

BACKGROUND

Active matrix displays comprise a plurality of pixels arranged in an array, wherein each pixel has a light emitting element. The light emitted by the light emitting elements of the pixels together forms an image presented by the display. The light emitting element may for instance be an Organic Light Emitting Diode (OLED) and the display may thus be an active matrix OLED (AMOLED) display.

Active matrix displays, such as AMOLED displays, may use a driving backplane, e.g., in the form of one or more thin-film transistor (TFT) arrays. The backplane may be manufactured in low temperature fabrication, which enables use of suitable substrates, e.g., to form flexible displays. Active matrix displays, such as AMOLED displays, are therefore frequently used in various applications and is also a promising technology for future applications.

A drive transistor may be used to drive a current through the OLED for emitting light from a pixel. If the OLED current is voltage controlled, the current through the OLED depends on a threshold voltage of the drive transistor, which may vary over time and variations may differ from pixel to pixel. Hence, in order to avoid a non-uniform output from the display, compensation circuits for handling variations in threshold voltage may be used. However, this implies that a larger number of transistors may be needed within a pixel, which may limit a resolution of the display.

SUMMARY

The present disclosure provides an active matrix display which is able to provide a uniform output of the display, compensating not only for threshold voltage variations, while enabling a high resolution of the display.

According to a first aspect, there is provided a method for driving an active matrix display, the display comprising a plurality of pixels arranged in an array, wherein each pixel comprises a drive transistor having a driver gate and wherein a current through the drive transistor for causing an intensity of light output by the pixel is controlled as a function of a difference between a voltage applied to the driver gate and a threshold voltage of the drive transistor, the method comprising: receiving information of a desired image to be displayed, the information defining a light intensity to be output by each pixel of the active matrix display; determining a compensated voltage for the driver gate for each pixel based on calibration data, which comprises a set of individual calibration values, wherein individual calibration values in the set apply to different pixels in the array, wherein the compensated voltage compensates for differences between pixels affecting a relation of the intensity of light output by the pixel as a function of the difference between the voltage applied to the driver gate and the threshold voltage of the drive transistor; and outputting the compensated voltage for the driver gate for each of the pixels in the active matrix display.

A relation defining light being output by the pixel as a function of a difference between a voltage applied to the driver gate and a threshold voltage of the drive transistor may vary between pixels. Thus, if the active matrix display uses a common relation to determine a voltage to be applied to the driver gate in order to compensate for a threshold voltage variation, the output for pixels of the display may not be uniform. For instance variations in manufacturing of the display, such as geometric variations of a structure of the drive transistor may cause differences between pixels in the relation defining light being output by the pixel as a function of a difference between a voltage applied to the driver gate and a threshold voltage of the drive transistor.

According to the present disclosure, a compensated voltage is determined for each pixel. The compensated voltage compensates for differences between pixels affecting the relation of the intensity of light output by the pixel as a function of the difference between the voltage applied to the driver gate and the threshold voltage of the drive transistor. This implies that the compensated voltage may help the display output light intensities in a more uniform manner across the entire display.

Hence, according to the present disclosure, there is provided a compensation for non-uniformities in the display, which does not only handle variations in threshold voltage. Rather, the compensated voltage handles how the difference between an applied voltage and a threshold voltage (possibly compensated for time variations) is related to the light being output.

The relation of the intensity of light output by the pixel as function of the difference between the voltage applied to the driver gate and the threshold voltage of the drive transistor may be a quadratic (or linear) function. This implies that a single or a few individual calibration values (constant(s) of the function) may be stored for each pixel, such that the compensated voltage may be calculated using a relationship based on the single or few individual calibration values and a known function. This implies that a desired light intensity may be used as input, and then the compensated voltage may be calculated for causing the desired light intensity to be output by the pixel. However, according to an alternative example, multiple individual calibration values may be stored for each pixel, wherein each individual calibration value may indicate a compensated voltage for the pixel for causing a specific level of the desired light intensity to be output. Hence, depending on the level of the desired light intensity, a corresponding look-up may be done among the individual calibration values stored for the pixel.

The differences between pixels affecting a relation of the intensity of light output by the pixel as a function of the difference between the voltage applied to the driver gate and the threshold voltage of the drive transistor may be due to differences in manufacturing of active matrix display. Thus, a calibration may be performed after manufacturing of the active matrix display in order to store the set of individual calibration values in the active matrix display.

According to an embodiment, the compensated voltage compensates at least for geometric variations of a structure of the drive transistor between different pixels. Even with a well-controlled manufacturing process, the drive transistors of different pixels may be manufactured with slight geometric variations in the structure. Such (undesired or unintended) geometric variations may cause different relations of the intensity of light output by the pixel as a function of the difference between the voltage applied to the driver gate and the threshold voltage of the drive transistor. By using the set of individual calibration values, these differences may be compensated for in the determined compensated voltage.

It should be realized that the compensated voltage need not necessarily (or solely) compensate for geometric variations of the structure of the drive transistor. For instance, the compensated voltage may also or alternatively compensate for variations in local material properties, charges captured in the dielectric during plasma etch processes, bias stress in the transistor, eventually accelerated under incident light or for a ground resistive drop, which may vary between pixels.

Threshold voltage variation will affect the difference between the voltage applied to the driver gate and the threshold voltage. Hence, threshold voltage variation, which may occur during use of the active matrix display, may affect intensity of light output by the pixel. A detection of the threshold voltage of each pixel may be performed at regular intervals in order to allow separate compensation for the threshold voltage variation. The detection of the threshold voltage of a pixel may be used in order to adjust or update the individual calibration values or may be used for separately compensating for differences in threshold voltage, such as by applying a different voltage to a back-gate of the drive transistor, as will be explained in further detail below.

A detection of threshold voltage of pixels may be regularly performed in order to perform a re-calibration handling threshold voltage variations. It may not be necessary to perform further re-calibrations to update a relation of the intensity of light output by the pixel as a function of the difference between the voltage applied to the driver gate and the threshold voltage of the drive transistor. However, it should be realized that the individual calibration values may be regularly updated in order to ensure that any changes in threshold voltage as well as any changes in the relation of the intensity of light output by the pixel as a function of the difference between the voltage applied to the driver gate and the threshold voltage of the drive transistor may be handled. Because such an update may require extensive measurements, it may be performed rarely, such as, e.g., once a week.

Hence, according to the present disclosure, an active matrix display may be driven to output light in a uniform manner while handling differences in threshold voltage between pixels as well as handling other variations in characteristics of pixels.

The method may output a value of a compensated voltage, which can be directly applied to the driver gate. However, it should be realized that the actual voltage that is to be applied to the driver gate may be based on further processing of the compensated voltage for the driver gate that is output. For instance, gamma correction may be applied to the compensated voltage for determining the voltage to be applied to the driver gate.

The information of a desired image to be displayed may be provided in any manner that is readable or understandable for driving the active matrix display. Thus, the information of the desired image may be provided as values for each pixel of the desired image. The values may directly define a light intensity to be output by each pixel of the active matrix display, such that the information may be directly used to determine the light intensities to be output by the pixels. Alternatively, the values may allow determining corresponding light intensities to be output, such that the information may indirectly define the light intensity to be output by each pixel. The method may then comprise processing the received information in order to determine the light intensities to be output by each pixel. The processing may include adapting the image to be displayed to characteristics of the active matrix display in order to improve a quality of the image displayed by the active matrix display.

According to an example embodiment, the calibration data is stored as a look-up table comprising a plurality of individual calibration values for the same pixel, wherein the plurality of individual calibration values relates different intensities of light to different voltages applied to the driver gate, wherein the determining of the compensated voltage comprises performing a look-up in the look-up table.

A table look-up may be very quickly performed. Thus, the determining of the compensated voltage in this manner allows a fast processing for determining the compensated voltage. However, using a look-up table requires a substantial amount of memory for storing the individual calibration values.

A calibration may measure currents through the drive transistor as provided with each possible level of the voltage to be applied to the driver gate. Thus, individual calibration values may be provided in the look-up table for all possible voltage levels.

The look-up table may determine the compensated voltage for a pixel based on a fixed value of the threshold voltage of the drive transistor of the pixel. Thus, if a change in the threshold voltage is detected, the look-up table may be changed, e.g., by adding a fixed offset based on the change in the threshold voltage to each of the individual calibration values for the pixel. Alternatively, the threshold voltage may be separately stored and used in a calculation of the compensated voltage based on a value determined from the look-up table.

At regular, relatively rare, intervals, an updated calibration may be performed in order to determine individual calibration values and replace the calibration values in the look-up table with new calibration values.

According to an example embodiment, the determining of the compensated voltage comprises interpolating between values received by performing the look-up in the look-up table.

Using an interpolation between values received from look-up in the look-up table may allow use of a smaller look-up table, as individual calibration values may not need to be provided in the look-up table for all possible voltage levels that may be applied to the driver gate. Thus, memory usage in the active matrix display may be saved.

The interpolation instead implies that a calculation is performed in order to determine the compensated voltage, when a voltage between values provided in the look-up table is desired, which implies that a process of determining the compensated voltage may be slower compared to only using a table look-up.

If fewer values are provided in the look-up table, accuracy of the compensated voltage may be decreased. Thus, a size of the look-up table may be selected based on available memory capacity and a desired accuracy in applying a correct voltage to the driver gate for achieving the desired intensity of light.

According to an example embodiment, the set of individual calibration values comprises constant values, wherein each constant value defines the relation of the intensity of light output by the pixel as a function of the difference between the voltage applied to the driver gate and the threshold voltage of the drive transistor.

Thus, one or more constant values may be provided for each pixel. Since the constant values may define the relationship for achieving an intensity of light, the compensated voltage may be calculated based on the stored constant values. This implies that storage of the set of individual calibration values may use a very small memory capacity. However, determining of the compensated voltage may involve performing a calculation, which may use more processing power and time.

A constant value for a pixel may correspond to a fixed value that relates the intensity of light output by the pixel to the difference between the voltage applied to the driver gate and the threshold voltage of the drive transistor. This constant value may be called a β-factor (or K-factor) and may be dependent, e.g., on geometric variations of the structure of the drive transistor or variations in local material parameters of the drive transistor.

According to an example embodiment, the set of individual calibration values further comprises threshold voltage values, wherein each threshold voltage value defines the threshold voltage for the drive transistor of the pixel.

The threshold voltage may be used in addition to the constant value in calculation of the compensated voltage. However, according to an alternative, the threshold voltage may be used as input for separately compensating for differences in threshold voltage, such as by applying a different voltage to a back-gate of the drive transistor.

According to an example embodiment, the determining of the compensated voltage comprises calculating the compensated voltage based at least on the light intensity to be output by the pixel and the constant value.

Thus, the method may comprise calculating the compensated voltage based on stored individual calibration values. This implies that the light intensity to be output by the pixel may be used as input, whereby the compensated voltage may be calculated using the constant value stored for the pixel.

The calculation may also use a stored threshold voltage for the pixel. However, if threshold voltage variation is separately compensated for, such as by applying a different voltage to a back-gate of the drive transistor, the calculation of the compensated voltage need not include the threshold voltage.

According to an example embodiment, the compensated voltage is calculated by the following formula, which can be used when driving the drive transistor in a saturation region:

$$V_{GS} = \sqrt{\frac{I_{DS}}{\beta}} + V_T, \qquad \text{(Eq. 1)}$$

where $V_{GS}$ is the compensated voltage with respect to a source of the drive transistor, $I_{DS}$ is the current through the drive transistor causing the light intensity to be output by the pixel, $\beta$ is the constant value, and $V_T$ is the threshold voltage.

The active matrix display may be used for driving the drive transistors in the saturation region. Then, the compensated voltage may be determined using a formula taking the current for causing the light intensity to be output by the pixel as input and using a stored constant value and threshold voltage for determining the compensated voltage.

It should be realized that the active matrix display may alternatively be configured for driving the drive transistors in a linear region. In such a case, a different formula may be used for calculating the compensated voltage, taking a voltage between the drain and source of the drive transistor into account.

According to an example embodiment, the compensated voltage is calculated as:

$$V_{GS} = \frac{I_{DS}}{2\beta V_{DS}} + V_T + \frac{V_{DS}}{2},$$

where $V_{DS}$ is the voltage between drain and source of the drive transistor.

The active matrix display may be used in different operating modes, wherein active matrix display may be controlled such that the drive transistors are either driven in the saturation region or in the linear region. The active matrix display may store different calibration values to be used depending on which operating mode is to be used. These calibration values may either be provided in form of a look-up table or for calculating the compensated voltage using a formula.

According to an example embodiment, each pixel is formed by a two-transistor, one-capacitor (2T1C) circuit, comprising the drive transistor, a select transistor for selectively connecting a dataline to the driver gate of the drive transistor, and a storage capacitor, which is connected between the driver gate of the drive transistor and a source of the drive transistor for maintaining data provided to the driver gate.

Thus, each pixel may be implemented using only a single drive transistor and a select transistor for selectively providing data to the driver gate. This implies that the active matrix display may be implemented with a very high resolution, as each pixel may occupy a smaller space and hence, pixels may be arranged closer to each other.

Although a very high resolution may be achieved using a 2T1C pixel circuit, it should be realized that other pixel circuits may be used. The determining of a compensated voltage for the driver gate may be used with any type of pixel circuit for controlling output of light by the pixel.

According to an example embodiment in which each pixel is formed by a 2T1C circuit, the determining of the compensated voltage takes variation of the threshold voltage into account.

Using the 2T1C pixel circuit, threshold voltage variation may not be compensated for in the pixel circuit. Thus, variation of the threshold voltage may be taken into account when the compensated voltage is determined. For instance, the compensated voltage may be calculated using Eq. 1 as set out above.

According to an example embodiment, each pixel is formed by a three-transistor, two-capacitor (3T2C) circuit, comprising the drive transistor having the driver gate and a calibration gate, a first select transistor for selectively connecting a first dataline to the driver gate of the drive transistor, a calibrate transistor for selectively connecting a second dataline to the calibration gate of the drive transistor, a first storage capacitor, which is connected between the driver gate of the drive transistor and a source of the drive transistor for maintaining data provided to the driver gate, and a second storage capacitor, which is connected between the calibration gate of the drive transistor and a source of the drive transistor for maintaining data provided to the calibration gate.

Thus, each pixel may comprise a dual-gate drive transistor. This implies that a calibration voltage may be provided at a calibration gate of the drive transistor, for instance a back-gate of the drive transistor. Hence, a threshold voltage variation may be compensated for by providing a corresponding voltage at the calibration gate of the drive transistor.

With the 3T2C pixel circuit, threshold voltage variation and other variations affecting the relation of the intensity of light output by the pixel as a function of the difference between the voltage applied to the driver gate and the threshold voltage of the drive transistor may be separately compensated for.

According to an example embodiment, the method further comprises measuring a threshold voltage for each pixel and storing a calibration gate voltage value for each pixel, wherein the calibration gate voltage value is set so that applying a voltage to the calibration gate in accordance with the calibration gate voltage value compensates for variation of the threshold voltage.

The stored calibration gate voltage value may thus be used for compensating for threshold voltage variations. The stored calibration gate value may be set in relation to a default threshold voltage for each pixel, such that the stored calibration gate value may compensate for a deviation of the measured threshold voltage in relation to the default threshold voltage.

A calibration gate voltage may be applied at regular intervals to the calibration gate of the drive transistor in order to help maintain a correct voltage at the calibration gate.

According to an example embodiment in which each pixel is formed by a 3T2C circuit, the determining of the compensated voltage comprises calculating the compensated voltage based only on the light intensity to be output by the pixel and a constant value.

Since threshold voltage variation may be compensated for by using the voltage applied to the calibration gate of the drive transistor, a threshold voltage need not be taken into account when calculating the compensated voltage. Thus, the compensated voltage may be calculated using only the light intensity to be output by the pixel and a constant value.

According to a second aspect, there is provided an active matrix display, comprising: a plurality of pixels arranged in an array, wherein each pixel comprises a drive transistor having a driver gate and wherein a current through the drive transistor for causing an intensity of light output by the pixel is controlled as a function of a difference between a voltage applied to the driver gate and a threshold voltage of the drive transistor; a data storage unit, which is configured to store calibration data, which comprises a set of individual calibration values, wherein individual calibration values in the set apply to different pixels in the array; a controller unit, which is configured to: (i) receive information of a desired image to be displayed, the information defining a light intensity to be output by each pixel of the active matrix display, (ii) determine a compensated voltage for the driver gate for each pixel based on the calibration data, wherein the compensated voltage compensates for differences between pixels affecting a relation of the intensity of light output by the pixel as function of the difference between the voltage applied to the driver gate and the threshold voltage of the drive transistor, and (iii) output the compensated voltage for the driver gate for each of the pixels in the active matrix display.

Effects and features of this second aspect are largely analogous to those described above in connection with the first aspect. Example embodiments mentioned in relation to the first aspect are largely compatible with the second aspect.

The use of a data storage unit storing calibration data may allow the active matrix display to be implemented using pixel circuitry including a small number of transistors, such that a high resolution display may be provided. Due to the calibration data being stored, the active matrix display may provide a compensation of non-uniformities in the display, which does not only handle variations in threshold voltage.

According to an example embodiment, each pixel comprises a light emitting diode, an organic light emitting diode, or a quantum dot light emitting diode for emitting light.

Thus, the active matrix display may include a suitable, small component for emitting light based on the current provided through the drive transistor.

According to an example embodiment, the drive transistors of the pixels are formed as thin-film transistors (TFT).

TFTs may be particularly useful for forming of flexible displays. However, the use of TFTs may also imply that threshold voltage variation and β-factor variation may occur between pixels. Therefore, use of the active matrix display that is able to determine a compensated voltage for the driver gate may be particularly useful when TFTs are used to form the drive transistors.

DETAILED DESCRIPTION

Figure 1:
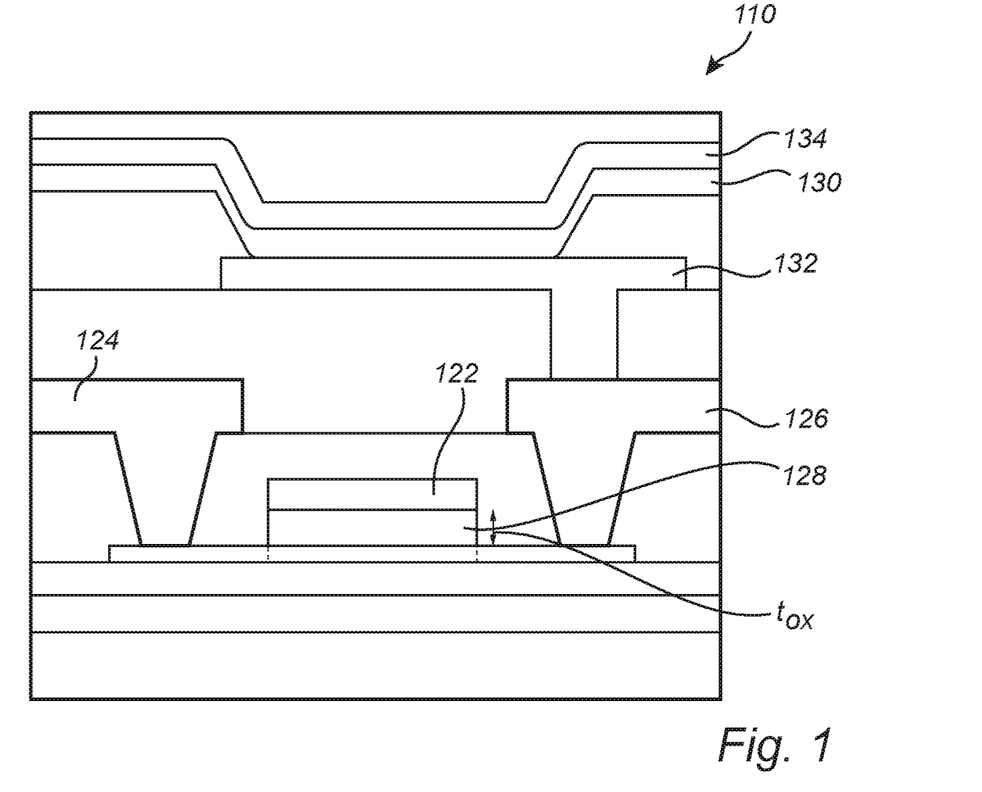
FIG. 1 is a schematic view of a cross-section of technology in an active matrix display according to an example embodiment.

FIG. 1 illustrates a cross-section, illustrating technology which may at least partially make up a pixel 110 in an active matrix display. The pixel 110 comprises a drive transistor 120, having a driver gate 122, a source 124, and a drain 126. The drain 126 is connected to a cathode 132 of an organic light emitting diode (OLED) 130. The OLEDs of the pixels of an array may have a common anode 134. A voltage applied to the driver gate 122 may control a drain-to-source current and, hence, a current through the OLED 130 for controlling the light emitted by the OLED 130.

It should be realized that the drive transistor 120 may be connected in alternative manners to the OLED. For instance, the source 124 may be connected to an anode of the OLED 130 and the OLEDs of the pixels of an array may then have a common cathode.

In examples where light emission by the pixels is provided by OLEDs, an active matrix OLED (AMOLED) display is provided. Although OLEDs are mainly discussed here, it should be realized that the active matrix display may be applied to other types of light emitting elements arranged in an array and controlled by an active matrix. Light emitting elements driven by a current may be provided in a number of different manners, e.g., using light-emitting diodes (LEDs) or quantum dot light emitting diode (QLED), although an AMOLED display may provide faster switching speeds of the pixels.

A topology for driving the OLEDs 130 of the pixels 110 may be arranged on a backplane of the display using thin film transistors. This may enable the AMOLED display to be flexible and to exhibit low power consumption, which makes use of the AMOLED display to be an interesting option in many applications.

The transistors for controlling the light output by the pixels 110 may be p-type as well as n-type transistors. The backplane may comprise a thin-film transistor (TFT), for instance hydrogenated amorphous Si (a-Si:H), polycrystalline silicon, organic semiconductor, (amorphous) indium-gallium zinc oxide (a-IGZO, IGZO) TFT.

The present disclosure may be applied to displays using active matrix, not being limited by a particular type of display. For instance, it may be applied to AMOLED displays, for instance RGB or RGBW AMOLED displays, which may comprise fluorescent or phosphorescent OLED, polymer or polydendrimers, high power efficiency phosphorescent polydendrimers, etc.

Figure 2:
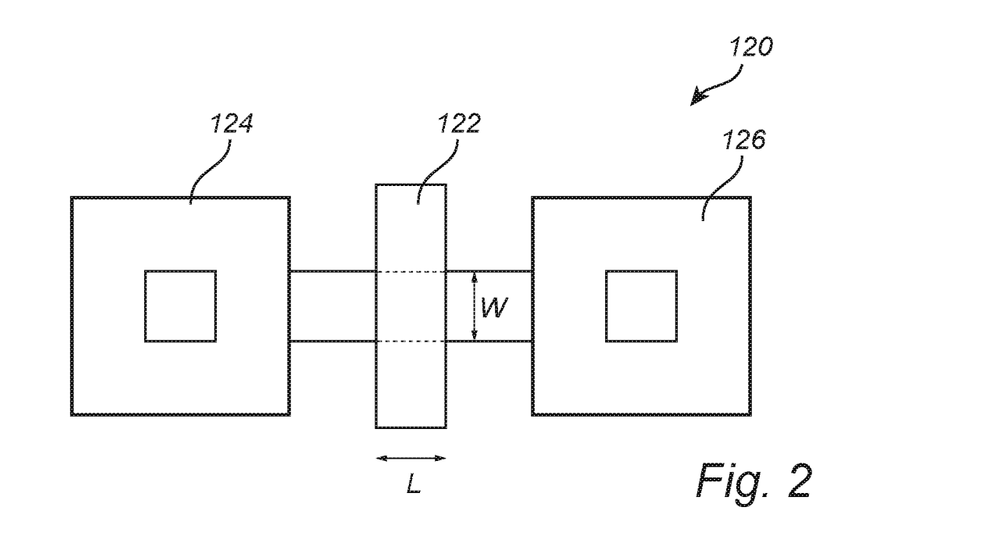
FIG. 2 is a top view of a drive transistor of a pixel.

FIG. 2 is a top view of the drive transistor 120, illustrating the driver gate 122, the source 124, and the drain 126.

When manufacturing an array of pixels 110, the pixels 110 may be designed to have specific geometric dimensions. The array of pixels 110 may be designed to have identical characteristics so as to provide identical functionality.

However, the manufacturing of the array of pixels 110 may not be perfect, such that process variations may cause pixels 110 to have geometric variations in the structure of the pixel 110. For instance, as illustrated in FIG. 2, a width W of the gate 122 may vary, and a length L of the gate 122 may vary. Further, a thickness $t_{ox}$ of a gate insulator 128 (see FIG. 1) may vary, and a dielectric constant $\varepsilon_{ox}$ may vary. This implies that a gate oxide capacitance per unit area $C_{ox}$, given by:

$$C_{ox} = \frac{\varepsilon_{ox}}{t_{ox}}$$

may also vary.

When driving the drive transistor 120 in a saturation region, the drain-to-source current $I_{DS}$ may be expressed as:

$$I_{DS} = \mu * C_{ox} * \frac{W}{L} \frac{(V_{GS} - V_T)^2}{2},$$

where $\mu$ is a mobility of a charge carrier, $V_{GS}$ is a gate-to-source bias as controlled by an applied voltage to the driver gate 122 of the drive transistor 120, and $V_T$ is a threshold voltage of the drive transistor 120.

When there is a variation in pixel characteristics, e.g., due to process variations in manufacturing of the array of pixels 110, a factor (herein denoted β) controlling a relation of the intensity of light output by the pixel 110 as a function of the difference between the voltage applied to the driver gate 122 and the threshold voltage of the drive transistor 120 may vary, wherein the factor β may be expressed as:

$$\beta = \frac{\mu * C_{ox}}{2} * \frac{W}{L}.$$

In particular, when using TFT technology for the drive transistors 120, the threshold voltage of the drive transistor 120 may be changed over time and may be differently changed for different pixels 110, e.g., depending on light output by each pixel 110. The drive transistors 120 of the pixels 110 may experience a bias-stress effect, i.e., a time-dependent trapping of charges from the channel of the drive transistor 120 into localized defect states in a semiconductor substrate, in the gate dielectric, or at an interface between semiconductor and dielectric. The trapped charges do not contribute to the current through the drive transistor 120 but affect a charge balance of the drive transistor 120. Thus, in use of the drive transistor 120, there may be a time-dependent shift of the threshold voltage due to bias stress.

Therefore, a threshold voltage may need to be estimated at regular intervals, e.g., by determining the drain-to-source current $I_{DS}$ based on a voltage $V_{GS}$ applied to the driver gate 122. However, according to the present disclosure, it is realized that if the β-factor varies for different pixels 110, estimation of the threshold voltage for threshold voltage compensation will only be relevant for a single level of the applied voltage $V_{GS}$.

Hence, according to the present disclosure, a result of a calibration measurement may be used. The calibration measurement may be quite extensive, as a plurality of measurements may be performed for each pixel 110 of the display. The calibration measurement may be performed after manufacturing of the display. This implies that the calibration measurement may be performed before the display is delivered to an end customer, and the results of the calibration measurement may be stored so as to allow the display to be correctly driven when in use. Alternatively or additionally, the calibration measurement may be regularly performed, e.g., once a week or once a month, so as to take into account any changes in behavior of driving the pixels 110.

The calibration measurement may measure the drain-to-source current $I_{DS}$ based on a voltage $V_{GS}$ applied to the driver gate 122 for a plurality of different voltage levels.

In one example embodiment, the drain-to-source current $I_{DS}$ is measured for each possible level of the voltage $V_{GS}$. This implies that the voltage $V_{GS}$ for different drain-to-source currents $I_{DS}$ is determined. These results may be stored as a look-up-table (LUT), which may be used to determine which voltage $V_{GS}$ is required for a certain desired current $I_{DS}$ for each pixel 110. When driving the display, the voltage to be applied to a pixel 110 may be simply selected from the LUT.

The LUT need not necessarily store data for each possible level of the voltage $V_{GS}$. This implies that a memory space required by the LUT may be limited. When driving the display, the voltage to be applied to a pixel 110 may be based on selecting at least two voltage values from the LUT and performing an interpolation operation to find a suitable voltage between the values selected from the LUT.

If a limited-size LUT is used, the calibration measurement need also not be performed for each possible level of the voltage $V_{GS}$. Rather, calibration measurements may be performed only for the data points stored in the LUT.

If fewer values are provided in the LUT, accuracy of the voltage to be applied to the pixel 110 may be decreased. Thus, a size of the LUT may be selected based on available memory capacity and a desired accuracy in applying a correct voltage to the driver gate 122 for achieving the desired intensity of light.

When using the calibration measurements to form a LUT, it is not necessary to know a reason of variation between pixels 110 of the relation of the intensity of light output by the pixel 110 as a function of the voltage applied to the driver gate 122. Rather, the LUT may just be used as an information source for determining the voltage to be applied to the driver gate 122.

However, according to an alternative example, the calibration measurements may be performed in order to determine the β-factor and the threshold voltage $V_T$ of each pixel 110. The calibration measurements may be performed for a number of different levels of the voltage $V_{GS}$. The more levels used, the more accurate determination of the β-factor and the threshold voltage $V_T$ may be made.

Based on the performed calibration measurements, an estimate of the β-factor and the threshold voltage $V_T$ may be determined for each pixel 110. The estimated β-factor and the estimated threshold voltage $V_T$ may be stored and used when determining the voltage to be applied to the driver gate 122. Then, the desired current $I_{DS}$ for a pixel 110 may be used as input, and the stored β-factor and threshold voltage $V_T$ may be used in calculation of the voltage to be applied to the driver gate 122.

The voltage may be calculated as:

$$V_{GS} = \sqrt{\frac{I_{DS}}{\beta}} + V_T.$$

As mentioned above, the threshold voltage may vary over time. Thus, updated calibration measurements may be periodically performed in order to determine a threshold voltage $V_T$ of the drive transistor 120 of each pixel 110.

Such updated calibration measurement may involve only a single measurement for each pixel 110, wherein a drain-to-source current $I_{DS}$ may be measured for a single level of the voltage $V_{GS}$. The measurement may then be used in order to estimate the threshold voltage $V_T$.

If the threshold voltage is stored for each pixel 110, the stored value may be updated based on the updated calibration measurement. If a LUT is used relating drain-to-source currents $I_{DS}$ to levels of the voltage $V_{GS}$, the LUT may be updated based on a fixed offset based on a change of the threshold voltage $V_T$ that may be determined using the updated calibration measurement.

Figure 3:
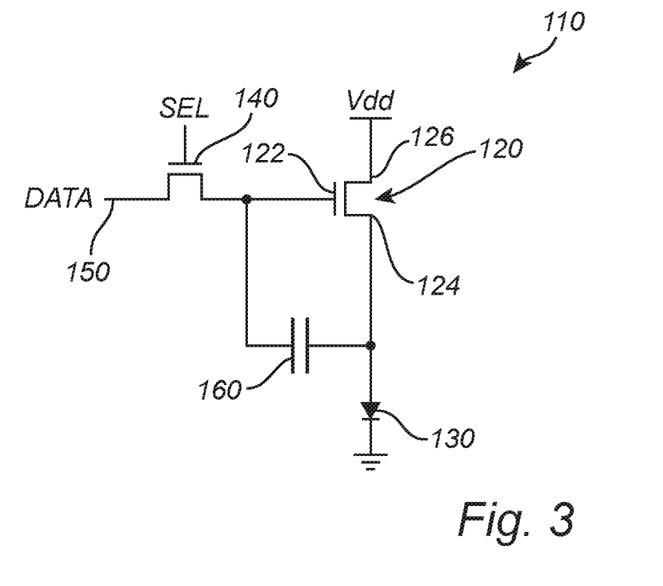
FIG. 3 is a schematic view of pixel circuitry according to a first example embodiment.

Referring now to FIG. 3, an example embodiment of pixel circuitry will be described. In FIG. 3, the pixel 110 is formed by a two-transistor, one-capacitor (2T1C) circuit. The pixel circuitry comprises the drive transistor 120 and a select transistor 140 for selectively connecting a dataline 150 to the driver gate 122 of the drive transistor 120.

A signal on the dataline 150 may be provided through the select transistor 140 to the driver gate 122 of the drive transistor 120. The signal on the dataline 150 may thus provide data for opening a channel in the drive transistor 120 and hence driving a current through the OLED 130, which is connected to the drain 126 or source 124 of the drive transistor 120. Here, the OLED 130 is illustrated as connected to the source 124 and being connected between the drive transistor 120 and ground. However, it should be realized that the OLED 130 may alternatively be connected between a supply voltage (Vac) and the drive transistor 120. A light output by the OLED 130 may depend on a current level through the OLED 130, such that control circuitry may control the light output by the pixel 110 by controlling data provided on the dataline 150.

The pixel circuitry may further comprise a storage capacitor 160, which is connected between the driver gate 122 of the drive transistor 120 and the source 124 of the drive transistor 120. This implies that data provided to the driver gate 122 may be maintained by the storage capacitor 160, e.g., to maintain an output by the pixel 110 in the display while driving data is provided to other pixels. The storage capacitor 160 may alternatively be connected to the drain 126 of the drive transistor 120.

Although such a storage capacitor 160 may ensure a well-controlled driving of the pixel 110, use may alternatively be made of parasitic capacitance between the driver gate 122 and the source 124 or drain 126 of the drive transistor 120 to maintain data on the driver gate 122.

Using the pixel circuitry illustrated in FIG. 3, a circuitry using a small number of components may be used for each pixel 110. This implies that each pixel 110 may be achieved in a small area, such that a large resolution of the display may be provided.

Figure 4:
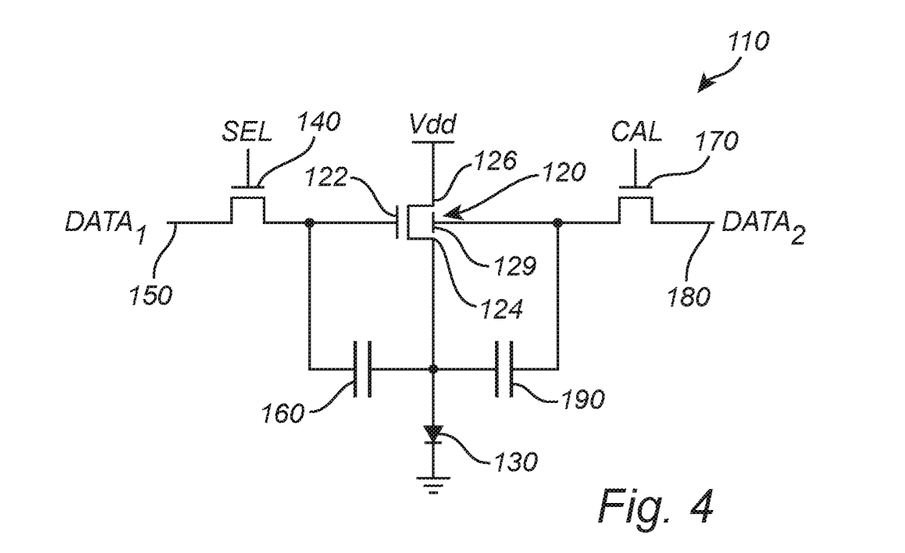
FIG. 4 is a schematic view of pixel circuitry according to a second example embodiment.

Referring now to FIG. 4, another embodiment of a pixel circuitry will be described. In FIG. 4, the pixel circuitry is formed by a three-transistor, two-capacitor (3T2C) circuit. The pixel circuitry comprises the drive transistor 120 having the driver gate 122 and a calibration gate 129, a first select transistor 140 for selectively connecting a first dataline 150 to the driver gate 122 of the drive transistor 120, a calibrate transistor 170 for selectively connecting a second dataline 180 to the calibration gate 129 of the drive transistor 120.

A signal on the first dataline 150 may be provided through the select transistor 140 to the driver gate 122 of the drive transistor 120. The signal on the first dataline 150 may thus provide data for opening a channel in the drive transistor 120 and hence driving a current through the OLED 130, which is connected to the drain 126 or source 124 of the drive transistor 120. Here, the OLED 130 is illustrated as being connected to the source 124 and being connected between the drive transistor 120 and ground. However, it should be realized that the OLED 130 may alternatively be connected between a supply voltage (Vac) and the drive transistor 120. A light output by the OLED 130 may depend on a current level through the OLED 130, such that control circuitry may control the light output by the pixel 110 by controlling data provided on the first dataline 150.

A signal on the second dataline 180 may be provided through the calibrate transistor 170 to the calibration gate 129 of the drive transistor 120. The signal on the second dataline 180 may thus provide data for setting a voltage at the calibration gate 129 of the drive transistor 120. This voltage at the calibration gate 129 may be adapted to compensate for a variation in threshold voltage of the drive transistor 120, such that the data provided on the first dataline 150 may disregard variations in the threshold voltage for controlling the light output by the pixel 110. The current driven through the OLED 130 may thus depend on the voltage difference between the voltage at the driver gate 122 and the source 124 of the drive transistor 120 and depend also on the voltage difference between the voltage at the calibration gate 129 and the source 124 of the drive transistor 120, wherein the voltage level at the calibration gate 129 is provided in relation to a default threshold voltage assumed by the data provided on the first dataline 150.

The pixel 110 may further comprise a first storage capacitor 160, which is connected between the driver gate 122 of the drive transistor 120 and the source 124 of the drive transistor 120. This implies that data provided to the driver gate 122 may be maintained by the storage capacitor 160, e.g., to maintain an output by the pixel 110 in the display while driving data is provided to other pixels. The first storage capacitor 160 may alternatively be connected to the drain 126 of the drive transistor 120.

Although such a first storage capacitor 160 may help provide a well-controlled driving of the pixel 110, use may alternatively be made of parasitic capacitance between the driver gate 122 and the source 124 or drain 126 of the drive transistor 120 to maintain data on the driver gate 122.

The pixel 110 may further comprise a second storage capacitor 190, which may be connected between the calibration gate 129 of the drive transistor 120 and the source 124 of the drive transistor 120. This implies that data provided to the calibration gate 129 may be maintained by the storage capacitor 190, e.g., to help ensure that calibration data is held on the calibration gate 129 for a substantial period of time without requiring that a new calibration signal is provided on the second dataline 180 to the calibration gate 129. The second storage capacitor 190 may alternatively be connected to the drain 126 of the drive transistor 120.

Although such a second storage capacitor 190 may help ensure that the calibration data is held for a substantial period of time at the calibration gate 129, use may alternatively be made of parasitic capacitance between the calibration gate 129 and the source 124 or drain 126 of the drive transistor 120 to maintain data on the calibration gate 129. Also, if no second storage capacitor 190 is provided, calibration data may instead be provided more frequently to the calibration gate 129 to refresh the calibration data and maintain the pixel 110 calibrated to the threshold voltage of the drive transistor 120 of the pixel 110.

Using the pixel circuitry illustrated in FIG. 4, a circuitry using a relatively small number of components may be used for each pixel 110. This implies that each pixel 110 may be achieved in a small area, such that a large resolution of the display may be provided.

Further, the pixel circuitry illustrated in FIG. 4 may actively compensate for threshold voltage variation by providing a voltage at the calibration gate 129. This implies that, for calculation of the voltage to be applied to the driver gate 122 of the drive transistor 120 of a pixel 110, the threshold voltage need not be taken into account and the calculation may correspond to:

$$V_{GS} = \sqrt{\frac{I_{DS}}{\beta}}.$$

Also, if a LUT is used for determining the voltage to be applied to the driver gate 122, the LUT need not be updated or adjusted even if the threshold voltage of the pixel 110 is changed. Rather, the voltage at the calibration gate 129 may be changed and the same relation between the applied voltage and the source-to-drain current as provided in the LUT may be used.

Figure 5:
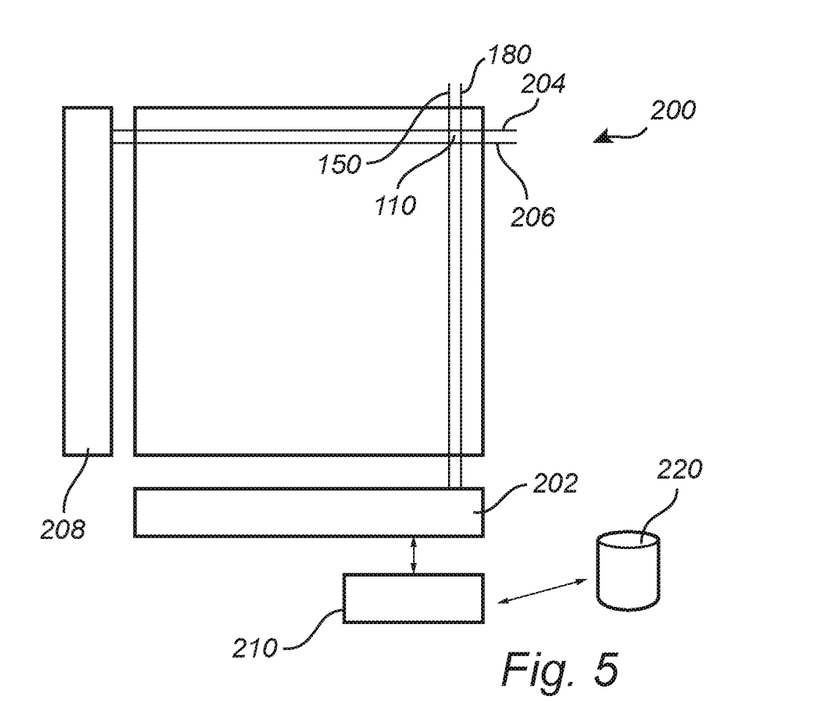
FIG. 5 is a schematic view of an active matrix display according to an example embodiment.

Referring now to FIG. 5, an active matrix display 200 comprising an array of pixels 110 arranged in rows and columns is schematically illustrated. The display 200 may comprise datalines 150 (and optionally datalines 180 depending on the pixel circuitry used), which run along a direction of the columns of the array. The display 200 further comprises control circuitry 202, which is connected to the datalines 150, 180. The control circuitry 202 may be arranged to provide data on the datalines 150, 180.

The control circuitry 202 may be provided as a data driver integrated circuit, which provides components for generating data signals to the datalines 150, 180.

The control circuitry 202 may be part of a controller unit 210, which may be configured to determine the data to be provided on the datalines 150, 180. Alternatively, the control circuitry may be connected to the controller unit 210 for receiving the data from the controller unit 210.

The controller unit 210 may further be connected to a data storage unit 220 for storing calibration data of the pixels 110. Alternatively, the data storage unit 220 may be formed as an integrated memory in the controller unit 210.

The display 200 may further comprise select lines 204 (and optionally calibrate lines 206 depending on the pixel circuitry used), which run along a direction of the rows of the array, perpendicular to the datalines 150, 180. The select lines 204 may provide signals for selectively activating the select transistors 140 in a row of pixels 110. Similarly, the calibrate lines 206 may provide signals for selectively activating the calibrate transistors 170 in a row of pixels 110.

The display 200 may further comprise a driver circuitry 208 for driving the select lines 204 and the calibrate lines 206. The driver circuitry 208 may for instance be arranged as an integrated Gate-In-Panel (GIP) on the backplane of the display 200. According to an alternative, the driver circuitry 208 may be provided as dedicated silicon drivers.

The controller unit 210 may have access to calibration data in the data storage unit 220. The calibration data may comprise a set of individual calibration values, wherein individual calibration values apply to different pixels 110 in the array.

As explained above, the calibration data may be stored as a LUT, wherein a plurality of data values are provided for each pixel 110 for relating a desired intensity of light to be output by the pixel 110 to corresponding voltages to be applied to the driver gate 122.

According to an alternative, the calibration data may be stored as one or more constant values for the pixel 110, which may be used in calculating the voltage to be applied to the driver gate 122 for achieving a desired intensity of light to be output by the pixel 110.

The controller unit 210 may be configured to receive information of a desired image to be displayed. The controller unit 210 may, based on this information, determine a light intensity to be output by each pixel 110, e.g., in the form of the drain-to-source current $I_{DS}$ to be provided in the pixel 110.

The controller unit 210 may use the drain-to-source current $I_{DS}$ as input to a process for determining the voltage to be applied to the driver gate 122 of the drive transistor 120 of the pixel 110. The process may be implemented as performing a look-up in a LUT, possibly in combination with a calculation of an interpolation value, or by directly calculating the voltage based on a known relation between the voltage to be applied and the drain-to-source current $I_{DS}$.

The determined voltage may be called a compensated voltage, since it takes into account variations between pixels 110 of the relation of the intensity of light output by the pixel as a function of the difference between the voltage applied to the driver gate and the threshold voltage of the drive transistor.

When using a 2T1C pixel circuit, two parameters (1/β and $V_T$) may be stored in the data storage unit 220 for every pixel 110. The calculation by the controller unit 210 may then comprise taking the desired drain-to-source current $I_{DS}$ as input and performing one multiplication (*1/β), followed by a square root and finally an addition (+$V_T$).

When using a 3T2C pixel circuit, two parameters (1/β and $V_{BG}$) may be stored in the data storage unit 220 for every pixel 110. The back-gate voltage ($V_{BG}$) may be applied to the calibration gate 120 and may hence be used for compensating threshold voltage variations. The calculation by the controller unit 210 may then comprise taking the desired drain-to-source current $I_{DS}$ as input and performing one multiplication (*1/β), followed by a square root.

It should be realized that the compensated voltage value need not be directly used as the voltage applied to the driver gate 122. For instance, further processing of the data to be output on the datalines 150 may be provided, such as performing gamma correction.

However, the gamma correction may in fact be combined with the calculation of the compensated voltage value in order to further decrease the number of operations to be performed by the controller unit. Thus, if a gamma correction, with y=2, is to be performed, the calculation by the controller unit 210 may be reduced to only one multiplication (*1/β).

The controller unit 210 may be implemented in hardware or as any combination of software and hardware. For instance, the controller unit 210 may comprise a central processing unit (CPU) comprising software for providing functionality of the controller unit 210 in a general-purpose processor. Alternatively, the controller unit 210 may be implemented as firmware arranged in an embedded system of the display 200. As a further alternative, the controller unit 210 may be implemented as a special-purpose circuitry for providing specific logical operations. Thus, the controller unit 210 may, e.g., be provided in the form of an application-specific integrated circuit (ASIC), an application-specific instruction-set processor (ASIP), or a field-programmable gate array (FPGA).

The data storage unit 220 may be implemented as any type of unit for storing data information, which may suitably be accessed and read by the controller unit 210. Thus, the data storage unit 220 may be implemented as a random access memory (RAM) a read-only memory (ROM), an electrically erasable programmable read-only memory (EEPROM), a flash memory, or the like.

Figure 6:
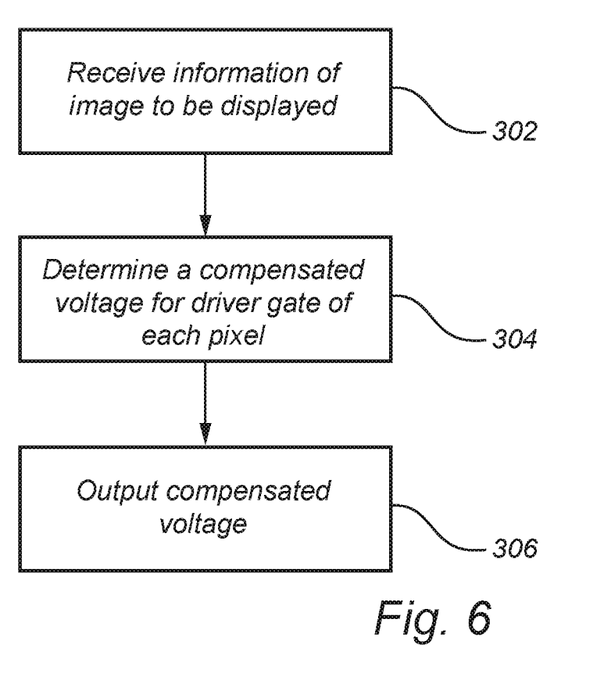
FIG. 6 is a flow chart of a method according to an example embodiment.

Referring now to FIG. 6, a method for driving an active matrix display 200 will be briefly described.

At step 302, the method comprises receiving information of a desired image to be displayed. The information may be provided in any suitable manner, e.g., using any type of protocol for coding image information. Also, it should be realized that a video or a stream of sequential images to be displayed may be received, such that the display 200 may be controlled to output a sequence of images.

The information may define a light intensity to be output by each pixel 110 of the active matrix display 200. However, the received information may first be decoded or processed in order to determine the light intensity to be output by each pixel 110 based on the received information.

At step 304, the method further comprises determining a compensated voltage for the driver gate 122 for each pixel 110 based on calibration data. The compensated voltage may be determined as a voltage to be applied to the driver gate 122 in order for the desired light intensity to be output. The compensated voltage may be determined, e.g., by look-up in a LUT or by calculation using stored calibration data, as explained above.

At step 306, the method further comprises outputting the compensated voltage for the driver gate 122 for each of the pixels 110 in the active matrix display 200. The compensated voltage value may thus be used as data to be provided to the datalines 150. Alternatively, further processing of the compensated voltage for the driver gate 122 may be provided in order to determine the data to be output on the datalines 150.

In the above, the present disclosure has mainly been described with reference to a limited number of examples. However, as is readily appreciated, other examples than the ones disclosed above are equally possible within the scope of the present disclosure, as defined by the appended claims.

What is claimed is:

1. A method for driving an active matrix display, the display comprising a plurality of pixels arranged in an array, wherein each pixel comprises a drive transistor having a driver gate, and wherein a current through the drive transistor for causing an intensity of light output by the pixel is controlled as a function of a difference between a voltage applied to the driver gate and a threshold voltage of the drive transistor, the method comprising:

receiving information of a desired image to be displayed, the information defining a light intensity to be output by each pixel of the active matrix display;

determining, for each pixel, a compensated voltage for the driver gate as a function of a β of the drive transistor and a calibration value, wherein the calibration value is specified in calibration data stored in a memory and that is associated with the active matrix display, wherein the calibration data comprises sets of individual calibration values, wherein each set of calibration values is associated with a different pixel in the array and calibration values within each set of calibration values facilitate relating different intensities of light to different voltages applied to the driver gate of the pixel, wherein the calibration values for each pixel are specified to compensate for differences in β among the pixels associated with the different voltages, wherein β is defined as:

$$\beta = \frac{\mu C_{ox}}{2} * \frac{W}{L},$$

wherein μ is a charge carrier mobility of the drive transistor, $C_{ox}$ is a gate oxide capacitance per unit area of the driver gate, W is a width of the driver gate, and L is a length of the driver gate; and outputting respective compensated voltage for the driver gate for each of the pixels in the active matrix display.

2. The method according to claim 1, wherein the calibration values of each set of calibration values are stored in a look-up table in the memory.

3. The method according to claim 2, wherein the determining of the respective compensated voltage comprises interpolating between calibration values received from the look-up table.

4. The method according to claim 1, wherein the sets of individual calibration values comprise respective values of β for each pixel of the plurality of pixels.

5. The method according to claim 4, wherein the sets of individual calibration values further comprise respective threshold voltage values, wherein each respective threshold voltage value defines a respective threshold voltage for a respective drive transistor of a respective pixel.

6. The method according to claim 4, wherein the determining of the respective compensated voltage comprises calculating the respective compensated voltage based at least on a desired light intensity to be output by the respective pixel and one of the respective values of β.

7. The method according to claim 6, wherein, when driving the drive transistor in a saturation region, the respective compensated voltage is calculated by the following formula:

$$V_{GS} = \sqrt{\frac{I_{DS}}{\beta}} + V_T,$$

wherein $V_{GS}$ is the respective compensated voltage with respect to a source of the drive transistor, $I_{DS}$ is the current through the drive transistor causing the desired light intensity to be output by the pixel, and $V_T$ is the threshold voltage.

8. The method according to claim 1, wherein each pixel is formed by a two-transistor, one-capacitor (2T1C) circuit, comprising (i) the drive transistor, (ii) a select transistor for selectively connecting a dataline to the driver gate of the drive transistor, and (iii) a storage capacitor connected between the driver gate of the drive transistor and a source of the drive transistor for maintaining data provided to the driver gate.

9. The method according to claim 8, wherein the determining of the respective compensated voltage compensates for a variation of the threshold voltage.

10. The method according to claim 1, wherein each pixel is formed by a three-transistor, two-capacitor (3T2C) circuit, comprising (i) the drive transistor having the driver gate and a calibration gate, (ii) a first select transistor for selectively connecting a first dataline to the driver gate of the drive transistor, (iii) a calibrate transistor for selectively connecting a second dataline to the calibration gate of the drive transistor, (iv) a first storage capacitor connected between the driver gate of the drive transistor and a source of the drive transistor for maintaining data provided to the driver gate, and (v) a second storage capacitor connected between the calibration gate of the drive transistor and the source of the drive transistor for maintaining data provided to the calibration gate.

11. The method according to claim 10, further comprising measuring a threshold voltage for each pixel and storing a calibration gate voltage value for each pixel, wherein the calibration gate voltage value is set so that applying a voltage to the calibration gate in accordance with the calibration gate voltage value compensates for a variation of the threshold voltage.

12. The method according to claim 11, wherein the determining of the compensated voltage comprises calculating the compensated voltage based only on the light intensity to be output by the pixel and a constant value.

13. An active matrix display, comprising:
a plurality of pixels arranged in an array, wherein each pixel comprises a drive transistor having a driver gate, and wherein a current through the drive transistor for causing an intensity of light output by the pixel is controlled as a function of a difference between a voltage applied to the driver gate and a threshold voltage of the drive transistor;
a data storage unit configured to store calibration data, wherein the calibration data comprises a set of individual calibration values, and wherein respective individual calibration values in the set apply to different pixels in the array; and
a controller unit configured to:
receive information of a desired image to be displayed, the information defining a light intensity to be output by each pixel of the active matrix display;
determine, for each, a compensated voltage for the driver gate as a function of a β of the drive transistor, and a calibration value, wherein the calibration value is specified in calibration data stored in a memory and that is associated with the active matrix display, wherein the calibration data comprises sets of calibration values, wherein each set of calibration values is associated with a different pixel in the array and calibration values within each set of calibration values facilitate relating different intensities of light to different voltages applied to the driver gate of the pixel, wherein the calibration values for each pixel are specified to compensate for differences in β among the pixels associated with the different voltages, wherein β is define as:

$$\beta = \frac{\mu C_{ox}}{2} * \frac{W}{L},$$

wherein μ a charge carrier mobility of the drive transistor, $C_{ox}$ is a gate oxide capacitance per unit area of the driver gate, W is a width of the driver gate, and L is a length of the driver gate; and
output respective compensated voltage for the driver gate for each of the pixels in the active matrix display.

14. The active matrix display according to claim 13, wherein each pixel comprises a light emitting diode, an organic light emitting diode, or a quantum dot light emitting diode for emitting light.

15. The active matrix display according to claim 13, wherein the drive transistors of the pixels are formed as thin-film transistors (TFT).

16. The active matrix display according to claim 13, wherein the calibration values of each set of calibration values is stored in a look-up table in the memory.

17. The active matrix display according to claim 13, wherein the sets of individual calibration values comprise respective values of β for each pixel of the plurality of pixels.

18. The active matrix display according to claim 17, wherein the sets of individual calibration values further comprise respective threshold voltage values, wherein each respective threshold voltage value defines a respective threshold voltage for a respective drive transistor of a respective pixel.

19. The active matrix display according to claim 17, wherein the determining of the respective compensated voltage comprises calculating the respective compensated voltage based at least on a desired light intensity to be output by the respective pixel and one of the respective values of β.

20. The active matrix display according to claim 19, wherein, when driving the drive transistor in a saturation region, the respective compensated voltage is calculated by the following formula:

$$V_{GS} = \sqrt{\frac{I_{DS}}{\beta}} + V_T,$$

wherein $V_{GS}$ is the respective compensated voltage with respect to a source of the drive transistor, $I_{DS}$ is the current through the drive transistor causing the desired light intensity to be output by the pixel, and $V_T$ is the threshold voltage.

* * * * *